United States Patent
Carson et al.

(10) Patent No.: US 6,921,318 B2
(45) Date of Patent: Jul. 26, 2005

(54) SEMICONDUCTOR DIE DE-PROCESSING USING A DIE HOLDER AND CHEMICAL MECHANICAL POLISHING

(75) Inventors: Bryan C. Carson, Meridian, ID (US); Scott E. Moore, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 955 days.

(21) Appl. No.: 09/885,314

(22) Filed: Jun. 19, 2001

(65) Prior Publication Data

US 2001/0037863 A1 Nov. 8, 2001

Related U.S. Application Data

(62) Division of application No. 09/369,740, filed on Aug. 6, 1999, now Pat. No. 6,248,001.

(51) Int. Cl.⁷ .................................................. B24B 1/00
(52) U.S. Cl. ........................ 451/41; 451/364; 438/977
(58) Field of Search .......................... 451/41, 364, 406; 438/4, 12, 691, 977; 216/21

(56) References Cited

U.S. PATENT DOCUMENTS

| | | | |
|---|---|---|---|
| 5,626,715 A | 5/1997 | Rostoker | 438/4 |
| 5,834,840 A | 11/1998 | Robbins | 257/705 |
| 5,922,620 A | 7/1999 | Shimomura | 438/693 |
| 6,031,292 A | 2/2000 | Murakami | 257/778 |
| 6,074,287 A | 6/2000 | Miyaji | 451/287 |
| 6,074,938 A | 6/2000 | Asamura | 438/533 |
| 6,087,733 A | 7/2000 | Maxim | 257/797 |
| 6,090,239 A | 7/2000 | Liu | 156/345 |
| 6,096,649 A | 8/2000 | Jang | 438/687 |
| 6,103,626 A | 8/2000 | Kim | 438/691 |
| 6,114,206 A | 9/2000 | Yu | 438/270 |
| 6,159,759 A | 12/2000 | Shao | 438/30 |
| 6,165,692 A | 12/2000 | Kanai | 430/311 |
| 6,171,982 B1 | 1/2001 | Sato | 438/795 |
| 6,743,697 B2 * | 6/2004 | Ravi | 438/459 |
| 2003/0109208 A1 * | 6/2003 | Engdahl et al. | 451/364 |
| 2004/0189986 A1 * | 9/2004 | Chen et al. | 356/218 |

* cited by examiner

Primary Examiner—Jacob K. Ackun, Jr.
(74) Attorney, Agent, or Firm—Kevin D. Martin

(57) ABSTRACT

A method and apparatus for removing layers from a circuit side of a semiconductor die includes the use of a holder, for example a semiconductor wafer having an opening therein for receiving the semiconductor die. Additionally the holder can include one or more layers thereover which are removed at a similar rate as those layers which comprise the semiconductor die. A die is placed into the opening and a circuit side of the die is aligned with a front side of the holder, for example using a generally planar surface, and is secured to the holder with an adhesive material. Using a holder reduces uneven layer removal which is known to occur in conventional processing, for example excessive removal at the edges of the die. A potting jig which aids in aligning and securing the die to the holder is also described.

16 Claims, 3 Drawing Sheets

SEMICONDUCTOR DIE DE-PROCESSING USING A DIE HOLDER AND CHEMICAL MECHANICAL POLISHING

RELATED U.S. APPLICATION DATA

This is a division of U.S. application Ser. No. 09/369,740, filed Aug. 6, 1999 and issued Jun. 19, 2001 as U.S. Pat. No. 6,248,001.

FIELD OF THE INVENTION

This invention relates to the field of semiconductor devices, and more particularly to a method and apparatus for removing one or more layers from a semiconductor die or wafer section.

BACKGROUND OF THE INVENTION

In the field of semiconductor manufacture there is often a need to de-process a semiconductor die by removing layers, which can be from several thousand angstroms (Å) thick to less than 100 Å thick, one at a time from the surface of the die. For example, de-processing a die aids in determining device failure mechanisms and is also useful in determining patent infringement of a competitor's part.

Current methods of die de-processing include removal of layers using a portable hand polisher such as those available from Buehler of Lake Bluff, Ill. and Allied of Rancho Dominguez, Calif. To use these polishers for die de-processing, the back (noncircuit side) of a semiconductor die is adhered to a generally planar support such as a "puck" with an adhesive such as pine tar. An abrasive pad, for example a material comprising a diamond lapping film, is mounted to a planar platen of the polisher. The polisher is activated and the abrasive pad is contacted with the circuit side of the die to remove layers therefrom.

Various problems result from this method of die de-processing. For example the leading edge of the die which first contacts the abrasive pad is removed at a faster rate than the remainder of the die. This results in more difficult data analysis than if the surface of the die is removed more uniformly.

Another de-processing method includes the removal of layers with an acid, but this method suffers from lack of control in chemical migration from one metal layer to another. Further, acid etches are not planar as various materials are etched at varying rates.

A method and structure for de-processing a semiconductor die which reduces or eliminates the problems described above would be desirable.

SUMMARY OF THE INVENTION

The present invention provides a new apparatus and method which reduces problems associated with the de-processing and analysis of semiconductor devices, particularly problems resulting from uneven removal of layers from the circuit side of a device. In accordance with one embodiment of the invention a semiconductor wafer having a die-shaped opening therein, and optionally having one or more layers to be polished or removed, is provided. The circuit side of the die and a generally planar first side of the wafer are aligned, for example by placing the die and the wafer on a flat surface. The die is secured to the wafer with an adhesive and any excess adhesive on the back of the die-wafer assembly is removed, either before or after the adhesive cures. Subsequently, portions of the circuit side of the die-wafer assembly are removed using mechanical planarization techniques, such as chemical mechanical polishing techniques.

Objects and advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

Figure 1:
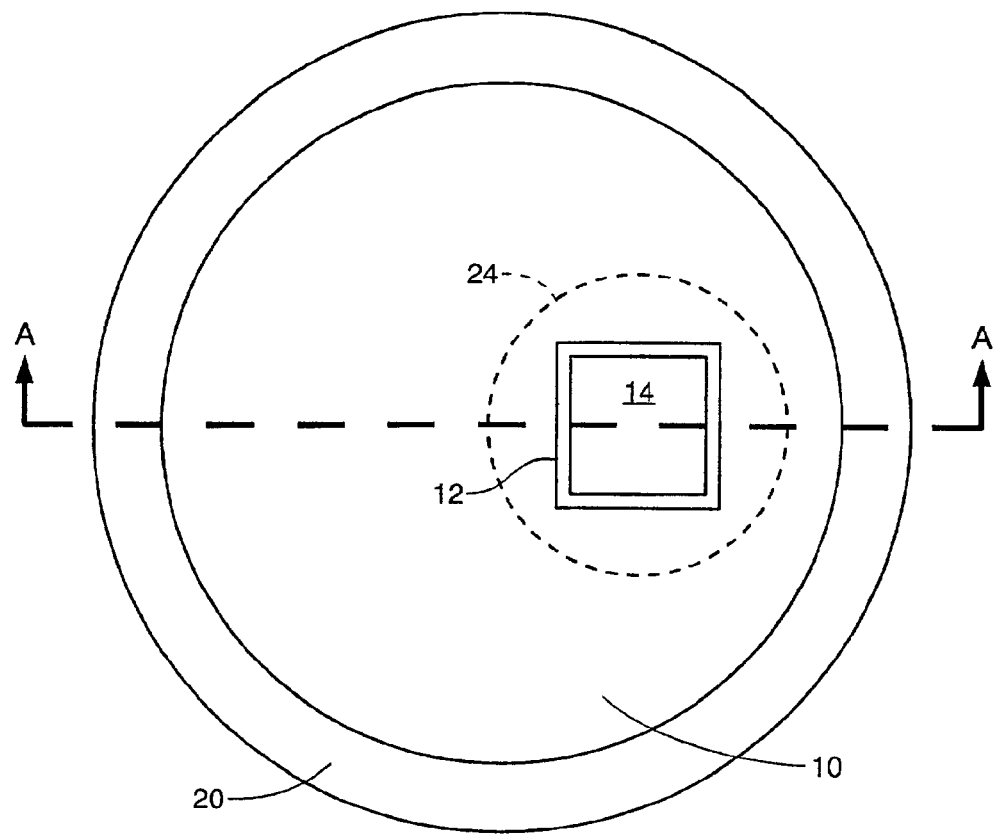
FIG. 1 is a top view of an inventive holder having a semiconductor die secured thereto.

FIG. 1 is a top view of a first embodiment of the invention. FIG. 1 depicts a die holder 10 which comprises a conventional semiconductor wafer (a "dummy" wafer) having a die-shaped aperture or opening 12 formed therein. The opening can be formed by laser cutting, chemically etching, or by mechanically cutting the wafer. Generally, the opening will be from about one mil to about 20 mils larger in both X- and Y-directions than the die 14 which is to be inserted therein. The location of the opening is preferably optimized for even removal of layers overlying the die, and will generally be located away from the center of the holder. A front side of the holder can further comprise a layer of material such as dielectric (not depicted in FIG. 1) as described below formed thereover by means known in the art.

Figure 2:
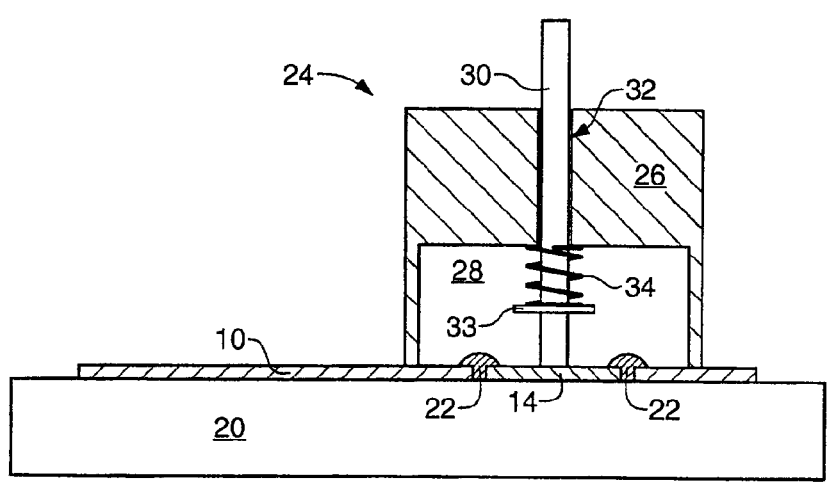
FIG. 2 is a cross section of a first embodiment of the invention.

The front side of the holder is placed on a flat mounting surface such as an optical flat 20 as depicted in FIG. 2. Optical flats, such as those manufactured from quartz, are known in the art and comprise a planar surface. Other generally flat mounting surfaces would be adequate as long as the wafer section and the holder can be aligned in generally coplanar relation without damage to the wafer section in a manner sufficient to facilitate die de-processing. A die 14 or other wafer section to be de-processed is placed within the opening with its circuit side contacting the optical flat. The flat aligns the front side of the holder with the circuit side of the die such that the two surfaces are generally coplanar.

Subsequently, an adhesive 22 is dispensed within the space between the holder 10 and the die 14 to fill the space. Epoxy adhesives such as Devcon 2-part 24 hour epoxy would function sufficiently. The adhesive can be applied in any sufficient manner such as by syringe dispensing, screen printing, or spraying. In the assembly depicted in FIG. 1, the adhesive is dispensed around four sides comprising a perimeter of the die into a space between the die and the holder.

A potting jig 24 such as that depicted in FIG. 2 may aid in aligning and securing the die 14 to the holder 10. The potting jig 24 comprises a generally circular or square block 26, for example manufactured from steel, having a recess 28 therein, a shaft 30, and a hole 32 in the block 26 for receiving the shaft 30. The shaft has a ring 33 affixed thereto, and a spring 34 is placed in recess 28 between the block 26 and the ring 33 such that the spring 34 urges the shaft 30 toward the die 14. During use, the die 14 and holder 10 are placed on the optical flat 20 then the jig 24 is placed on the holder 10. As the holder depicted is held in position by gravity it must be of mass to maintain the position of the holder against the optical flat. The shaft 30 applies downward pressure to the die 14 and holds the die in position. The die can be released from contact with the shaft by lifting on the end of the shaft which protrudes from the block as depicted in FIG. 2. The die can be manually positioned through an access hole in the side of the mount so that the die is generally aligned within the opening in the holder. A syringe can be used to dispense the adhesive 22 (or potting material) around the perimeter of the die to fill the space between the die 14 and the holder 10.

After dispensing the adhesive it is cured and any excess material on the back of the die-holder assembly, such as the bead of adhesive depicted in FIG. 2, is removed, for example by backgrinding the assembly.

Once the adhesive is cured the die-holder assembly is removed from the optical flat and background if necessary, then die de-processing is initiated. The various layers on the circuit side of the die can be removed using chemical mechanical polishing (CMP) techniques to polish one or more layers from the die surface. CMP techniques are well known in the art and comprise the use of a slurry having both a chemical component which chemically reacts with overlying layers and fixed abrasives to mechanically remove overlying layers. The slurry therefore comprises one or more active chemical components and one or more inert abrasive chemistries. As the edges of the die are generally coplanar with the front surface of the holder the entire surface of the die is removed at generally the same rate. This is in contrast to conventional techniques discussed above in which the edges of the die (and specifically the leading edge of the die) are removed at a faster rate than the central region of the die.

Preferably, an adhesive is selected which will be removed during subsequent steps at about the same rate as layers overlying the die. However, most adhesives used as potting material will be removed at a somewhat faster rate than the removal of layers from the circuit side of the die. This will not significantly impact the even removal of layers from the circuit side of the die. Further, the adhesive which is removed will mix with the CMP slurry but does not adversely affect the removal of the layer overlying the die.

Figure 3:
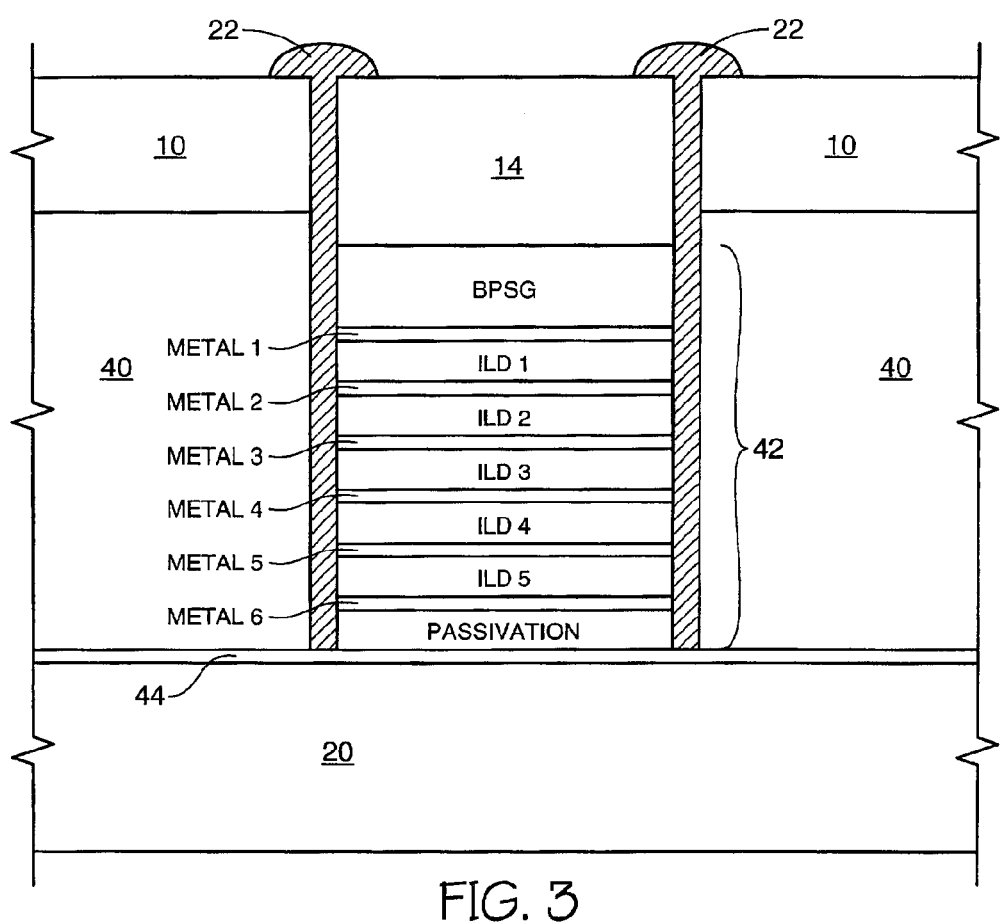
FIG. 3 is a cross section of the area surrounding the die of one embodiment of the invention.

To aid in the even removal of layers from the circuit side of the die, one or more layers 40 can be formed over the front of the holder 10 as depicted in FIG. 3, preferably prior to forming the opening 12 in the holder 10. For example, a layer of oxide such as borophosphosilicate glass (BPSG) or tetraethyl orthosilicate (TEOS) can be formed over the holder. Thus the layer over the front of the holder will be removed at the same time and preferably at the same rate as the layers 42 over the circuit side of the die 14 and may provide a more uniform die de-processing procedure.

Additionally, depending on the adhesive used to secure the die within the holder, it may be useful to provide a coating of an adhesive release layer 44 between the optical flat 20 and the die-holder assembly as depicted in FIG. 3. Preferably, the release layer 44 is dispensed on the optical flat prior to its contact with the holder. The coating can include polyimide, Teflon®, general purpose mold release, or Dow Corning 200, for example having a viscosity of 100,000 centipoise (cP). Such a coating will reduce the likelihood of the cured adhesive adhering to the optical flat which may result in damage to the die or to the holder as they are removed from the optical flat.

A die will generally be polished to remove a layer and then will be inspected, then repolished to remove another layer. This process will continue until analysis is completed.

Figure 4:
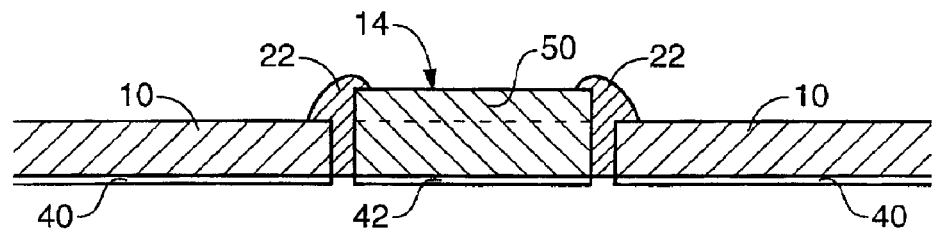
FIG. 4 is a cross section depicting an arrangement having a wafer section which is thicker than the holder.

Various other modifications to the invention may be required or desirable depending on the arrangement of the wafer section and the holder. For example, FIG. 4 depicts an arrangement wherein the wafer section 14 is thicker than the holder 10. The excess portion 50 of the wafer section extending above the level of the back of the holder can easily be ground off using conventional backgrinding techniques if necessary to provide a generally planar surface across the back of the holder-wafer section assembly.

Figure 5:
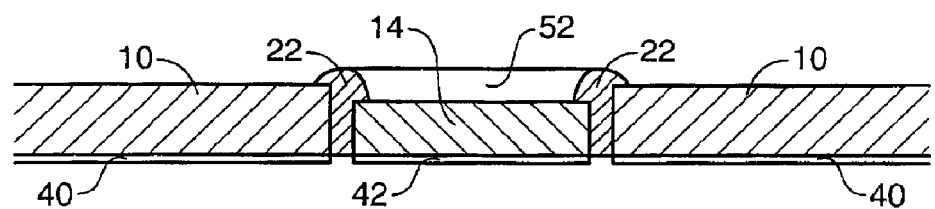
FIG. 5 is a cross section depicting an assembly wherein the wafer section is thinner than the holder.

FIG. 5 depicts an arrangement wherein the wafer section 14 is thinner than the holder 10. With this assembly, the potting material 22 can be provided as described above, then additional fill material 52 can be dispensed across the back of the wafer section, cured, then ground off using conventional backgrinding techniques to provide a planar back surface. Alternately, the uncured fill material can be dispensed and formed before it is cured such that it is planar after the fill material is cured such that a backgrinding step is not required.

Figure 6:
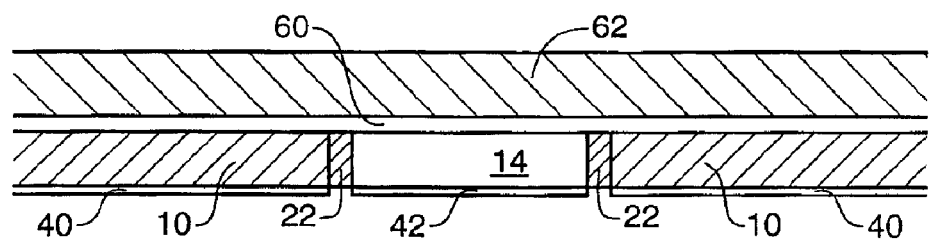
FIG. 6 is a cross section depicting an assembly having a backing on the wafer section-holder assembly.

FIG. 6 depicts another assembly in which the potting material 22 is applied to the holder, cured, and ground. An adhesive 60, such as an epoxy or methacrylate adhesive, is applied to the back of the holder-wafer section assembly and a backing 62, such as an additional semiconductor wafer, is adhered to the back of the assembly. The backing can be advantageous where backgrinding or other factors, such as a thin holder and wafer section for thin small outline packages (TSOP), has left the wafer section-holder assembly thin and fragile thereby increasing the likelihood of damage to the assembly. Further, an excessively thin assembly may not be adequately held by the carrier of the polishing apparatus. The backing provides additional support and thickness.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, two or more singularized or unsingularized semiconductor die can be de-processed simultaneously. Further, holders manufactured from other materials may be sufficient, although a semiconductor wafer is preferable. Also, instead of the jig described other alignment fixtures can be used to temporarily hold the wafer section in alignment with the holder while the adhesive or potting material is applied. Such alignment fixtures include a vacuum supplied to the die through a hole in the holder, an adhesive material such as an adhesive polymer of the type used to secure semiconductor die during a wafer sawing process, or by various clamps. It is therefore contemplated that the appended claims will cover any such modifications or embodiments as fall within the true scope of the invention.

What is claimed is:

1. An apparatus used to de-process a semiconductor device, comprising:

a holder having an opening therein said opening adapted to receive a semiconductor device, said holder further having at least one layer of material formed therover; and an alignment fixture having a generally planer surface for receiving and aligning a surface of said holder with a surface of a semiconductor device received by said opening in said holder.

2. The apparatus of claim 1 in combination with a semiconductor device having a generally planar surface, wherein said holder further comprises a generally flat surface and wherein said planar surface of said semiconductor device and said generally flat surface of said holder contact said generally planar surface of said alignment fixture.

3. The apparatus of claim 2 wherein said semiconductor device has a length and a width and said opening has a length between about 1 and about 20 mils longer than said length of said width of said semiconductor device.

4. The apparatus of claim 3 further comprising a potting material which fills a space between said semiconductor device and said holder and secures said semiconductor device to said holder.

5. The apparatus of claim 2 wherein said holder is a semiconductor wafer.

6. The apparatus of claim 2 further comprising a potting jig comprising:
   a block contacting said holder and having a hole and a recess therein;
   a shaft received by said hole in said block; and
   a spring received by said recess adapted to urge said shaft toward said semiconductor device and to hold said Semiconductor device in alignment against said alignment fixture.

7. An apparatus for de-processing a semiconductor wafer section, comprising:
   a wafer section holder having a substantially flat surface and an opening therein, said opening adapted to receive a semiconductor device;
   an alignment fixture having a substantially flat surface adapted to align said substantially flat surface of said holder with a substantially flat surface of a semiconductor wafer section; and
   a potting jig adapted to urge said substantially flat surface of said holder and a substantially flat surface of a semiconductor wafer section against said substantially flat surface of said alignment fixture.

8. The apparatus of claim 7 wherein said potting jig further comprises:

a block having a hole therethrough;
a shaft having a first end and a second end, said shaft received by said hole in said block; and
a spring adapted to urge said first end of said shaft away from said block and toward said alignment fixture.

9. The apparatus of claim 8 further comprising a ring affixed to said shaft and contacting said spring, wherein said spring is adapted to urge said ring and said first end of said shaft away from said block and toward said alignment fixture.

10. The apparatus of claim 9 in combination with a semiconductor wafer section, further comprising a potting material which secures said wafer section to said wafer section holder.

11. The apparatus of claim 10 further comprising a sacrificial layer over a surface of said wafer holder, wherein said sacrificial layer is interposed between said wafer holder and said alignment fixture.

12. The apparatus of claim 7 further comprising an adhesive release layer interposed between said wafer section holder and said alignment fixture.

13. An apparatus used during de-processing of a semiconductor wafer section comprising:
   a semiconductor wafer section holder having an opening therein and a substantially flat surface;
   a semiconductor wafer section to be de-processed having a substantially flat surface, wherein said wafer section is received in said opening in said holder and said flat surface of said holder and said flat surface of said wafer section are substantially coplanar; and
   an adhesive which attaches said holder with said wafer section.

14. The apparatus of claim 13 wherein said holder further comprises at least one sacrificial layer of material over a front side of said holder.

15. The apparatus of claim 14 wherein said semiconductor wafer section further comprises at least one layer to be removed, wherein said at least one wafer section layer to be removed and said at least one sacrificial layer of material over said front of said holder comprise a dielectric material.

16. The apparatus of claim 13 further comprising:
   at least one dielectric layer and at least one metal layer over a surface of said holder; and
   at least one dielectric layer and at least one metal layer over a surface of said wafer section.

* * * * *